Aug. 20, 1968 W. SHOCKLEY 3,398,334

SEMICONDUCTOR DEVICE HAVING REGIONS OF DIFFERENT CONDUCTIVITY TYPES WHEREIN CURRENT IS CARRIED BY THE SAME TYPE OF CARRIER IN ALL SAID REGIONS

Filed Nov. 23, 1964

WILLIAM SHOCKLEY
INVENTOR.

BY
Flehr and Swain
ATTORNEYS

United States Patent Office 3,398,334
Patented Aug. 20, 1968

3,398,334
SEMICONDUCTOR DEVICE HAVING REGIONS OF DIFFERENT CONDUCTIVITY TYPES WHEREIN CURRENT IS CARRIED BY THE SAME TYPE OF CARRIER IN ALL SAID REGIONS

William Shockley, Los Altos, Calif., assignor, by mesne assignments, to International Telephone and Telegraph Corporation, New York, N.Y., a corporation of Maryland Filed Nov. 23, 1964, Ser. No. 412,959
7 Claims. (Cl. 317—234)

ABSTRACT OF THE DISCLOSURE

A semiconductor device having adjacent regions of differing conductivity types with electrodes to at least two of said regions, wherein current flow between the electrodes is carried essentially by only one type of carrier, i.e. either by free electrons or by holes. In conventional semiconductor devices, current is carried by free electrons in N-type regions and by holes in P-type regions; in the device described herein, current is carried by one of these types in all regions, regardless of conductivity type. This effect is achieved by making one of the regions sufficiently thin so that the boundary between said region and an adjacent region of different conductivity type forms a potential barrier for majority carriers of said adjacent region; the thin region is designed to produce a potential barrier of limited height at said boundary, so that the electrostatic potential energy profile in the vicinity of said boundary does not cross the Fermi level. The net result is that the thin region behaves as though it had the same conductivity type as the adjacent region, while providing the desired majority carrier potential barrier required to reproduce a rectifying characteristic between the device electrodes. The boundary between the aforementioned regions is not a P-N junction in the conventional sense, but more nearly resembles the Schottky type barrier produced at certain metal-semiconductor interfaces exhibiting rectifying characteristics. Disclosed herein are a diode and a transistor employing the aforementioned majority carrier principle.

This invention relates to semiconductor devices and more particularly to unipolar semiconductor devices including diodes and triodes.

In the conventional p-n junction diode, both types of carriers, i.e., electrons and holes, are present. While the conduction is primarily due to the type of carrier which is present in the majority, there is also some conduction because of minority carriers. With a forward bias across a p-n junction, minority carriers are injected across the junction (e.g., holes are injected into n-type material) and when the bias is reversed, the minority carriers remaining in a region must either diffuse back to the junction or recombine before the diode acquires a high resistance. There is, therefore, what is called minority carrier storage. This results in a time delay in switching from the "on" to the "off" condition. This time delay may become appreciable when the diode is being used in high frequency applications, such as pulse circuits.

In a high frequency transistor which includes an emitter, base and collector region defining two p-n junctions, the same carrier storage may affect the high frequency operation of the device. Carriers flow through the base region by diffusion of thermally excited carriers. They have low velocity, and for high frequency generation, the base layer must be made relatively thin. Transistors operate by employing both types of carriers.

It is an object of the present invention to provide a semiconductor device in which minority carrier storage is substantially reduced thereby increasing the high frequency performance.

It is a further object of the present invention to provide a semiconductor device which depends primarily upon one type of carrier for conduction and operation, i.e., a unipolar device.

It is a further object of the present invention to provide a semiconductor device which includes one or more transitions from regions of one conductivity type to regions with excess chemical impurities of the opposite type in which the change in electrostatic potential is so small that one type of carrier has negligible concentration throughout the structure.

It is a further object of the present invention to provide a unipolar diode in which one of the layers is so thin that the electrostatic potential energy in the diode is always less than the Fermi level at the junction.

It is another object of the present invention to provide a unipolar diode including four zones or layers of material containing different concentrations of donor and acceptor impurities with the first and fourth zones containing an excess of one type of impurities and the second zone is thin and contains an excess of the other type of impurity.

It is a further object of the present invention to provide a unipolar semiconductor device which essentially comprises a pair of unipolar diodes of the above type forming a three terminal device with a common region.

It is another object of the preent invention to provide a unipolar semiconductor device in which an injecting unipolar diode injects hot carriers into a common or transport region which forms a part of a collecting unipolar diode.

It is a further object of the present invention to provide a unipolar semiconductor device or triode which employs hot carriers.

These and other objects of the invention will become more clearly apparent from the following description taken in conjunction with the accompanying drawing.

Referring to the drawing.

Although the present invention relates to unipolar semiconductor devices, both diodes, triodes and the like, it is believed that the understanding of the operation of the triode will be facilitated by first describing the operation of a unipolar diode incorporating the present invention.

In a unipolar diode in accordance with the invention, various zones of a piece of a semiconductor material are doped or formed with varying concentrations of donor and acceptor elements so that minority carrier storage is minimized. This may be accomplished by arranging the concentrations of donor and acceptor elements through the semiconductor material so that nowhere within the material does the electrostatic potential energy for an electron, referred to as $E_i$, rise above the Fermi level in the material (see W. Shockley, "Electrons and Holes in Semiconductors," D. Van Nostrand, 1950, pages 302 et seq.).

Figure 1:
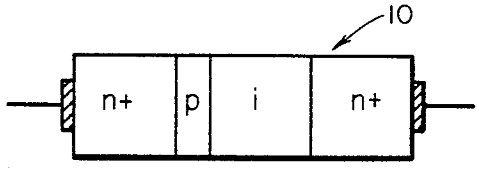
FIGURE 1 is a representation of a unipolar diode embodying the teaching of the present invention.
Figure 4:
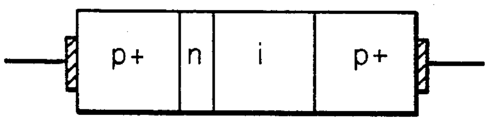
FIGURE 4 is a schematic representation of a unipolar diode having regions of opposite conductivity type to those shown in FIGURE 1.

A preferred embodiment of the invention is shown in FIGURE 1 wherein a single piece of semiconductor material 10 is composed of four serially adjacent layers or zones making up the length of the material, each zone having a different concentration of donor or acceptor elements than its adjacent zone or zones. The device illustrated comprises an n-type region (n+) forming a rectifying junction with a relatively thin p-type region (p). An intrinsic region (i) is contiguous with the other surface of the p-type region and an n-type region (n+) is contiguous with the other surface of the intrinsic region. When coupled into a circuit as a diode, ohmic electrical connections are made to the outer n+ zones. It will be apparent that the conductivity type may be reversed as shown in FIGURE 4 where a device having a p-n-i-p configuration is shown.

The desired minority carrier suppression is obtained by controlling the relative thicknesses of the zones and the concentrations of the donor and acceptor elements therein. Here and elsewhere, thickness is measured in a direction at right angles to the junctions or interfaces. The design considerations are those usually used to calculate the widths of space-charge or depletion layers in semiconductors and involve well known applications of Poisson's equation to the "chemical charge densities" of donors and acceptors. The thin layers considered in these devices are neither n-type nor p-type nor intrinsic in the conventional sense since under conditions of equilibrium they have carrier concentrations which are approximately those of intrinsic material. On the other hand, they have unbalanced donor and acceptor densities corresponding to heavily or moderately doped materials. These layers through Poisson's equation give rise to electrostatic dipole layers that simulate work functions of metals in holding carriers within the bodies they bound and may be appropriately referred to as "work function layers." These layers can thus act, as described below, to give rectifying action similar to that occurring in metal semiconductor contact while retaining the advantages of homogeneous monocrystal physical structure.

Figure 2:
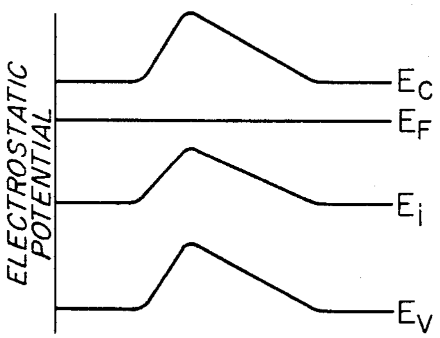
FIGURE 2 is the energy band diagram of the diode of FIGURE 1.

FIGURE 2 is an electrostatic potential energy diagram for the structure of FIGURE 1 using an n-p-i-n construction with no external applied voltages. $E_C$ represents the lower level of the conduction band; $E_V$ represents the upper level of the valence band, the forbidden energy gap lying between the curves $E_C$ and $E_V$; and $E_F$ represents the Fermi level in the material. The p-type zone is made thin enough so that, with the particular donor and acceptor concentrations existing in the structure, the $E_i$ level of the curve $E_i$ is everywhere within the structure below the Fermi level. When the unipolar diode of the invention is constructed to have the electron energy characteristics as shown in FIGURE 2, there will be negligible minority carrier conduction within the diode at least at conditions of small applied voltages. For conditions of applied voltages, the role that may be played by minority carriers and means of suppressing them can be better understood after considering the explanation of rectification characteristics discussed in FIGURE 3.

Figure 3:
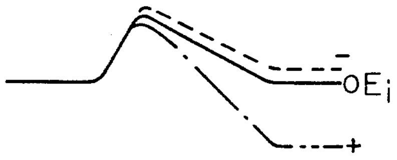
FIGURE 3 is the electrostatic potential energy diagram of the diode of FIGURE 1 for various conditions of applied bias.

The structure of FIGURE 1 may be operated as a rectifier. In FIGURE 3, the solid line is the electrostatic potential energy curve $E_i$ of FIGURE 2 with zero external voltage or bias applied. The dashed line shows the electrostatic potential energy when a forward bias is applied to the structure of FIGURE 1. Forward bias is obtained by applying to the right-hand side of the device a negative voltage with respect to the left-hand side as viewed in FIGURE 1. This results in conduction of electrons from right to left as viewed in FIGURE 1. The dot-dash line indicates the electron potential energy for reverse bias showing the high potential barrier created blocking conduction of electrons from left to right, thereby providing the rectification. It is evident that work function layer of acceptor dominated material plays an essential role in this rectification by providing the unsymmetrically located pi transition barrier between the two n+ regions.

It is evident for the reverse bias situation represented in FIGURE 3 that minority holes generated either in the positively biased n-region or in the i layer will tend to diffuse or drift. As a consequence, they will accumulate at the position of minimum electrostatic potential in the p-layer; this occurs at the location of maximum of the conduction band energy. In order to make this accumulation of holes be unimportant, it suffices to make the lifetime for carriers in the p-layer be substantially less than it is in the i and n regions where they are generated. This can be accomplished by any of the well known means of reducing lifetime such as by diffusing recombination centers inwards from the surface or producing bombardment damage at limited depth by electrons, protons or alpha particles. This reduction in lifetime can extend into the n zone on the left since this will also act to maintain the hole concentration in the p-layer in equilibrium with the electron concentration. For a silicon device as is well known from the Sah, Noyce, Shockley Proc. IRE, 45, 1228 (1957) article, the most effective region for recombination is in the space charge layer of the junction.

A fuller understanding of the advantages of the diodes discussed here can be obtained by considering the difference between their operation for forward bias conditions and the operation of a p-n junction. For a p-n junction forward current is carried by an inward flow of majority carriers from both sides with an inevitable and undesired storage of carriers of both signs in the region at or near the junction. For the diodes of this invention, majority carriers pass into one side and out the other. As shown by the forward curve of FIGURE 3, there is an increase in number of electrons in the i layer but only that necessary to reduce the voltage across this layer; essentially the charge needed to change the voltage across the diode capacitance This increase in electron concentration tends to suppress holes in the p-layer and thus forward current flow tends to decrease the number of holes present rather to increase them as forward current would in a p-n junction.

As previously described, an alternative embodiment of the invention is shown in FIGURE 4, wherein a single piece of semiconductor material having four zones p-n-i-p with ohmic connections made to the end zones. In the structure shown in FIGURE 4, holes are the dominant carriers which are controlled and an effort is made to suppress the minority carriers (electrons). This is again achieved by proper tailoring of the device so that the electrostatic potential energy, with no external applied voltage, does not cross the Fermi level.

While the preferred embodiments of the invention have been described above, other alternative embodiments may be produced which serve to suppress minority carriers and achieve the objects of the invention. For example, the intrinsic zone (i) may be composed of lightly doped n or p-type material (i.e., having a lesser concentration of donor or acceptor elements than the other zones). Furthermore, it is clear that the outer zones need not have the same concentration of donor or acceptor elements.

From design considerations based on the above described unipolar diode, the following examples will exemplify practical devices. The thickness of the p-type layer in a n-p-i-n unit composed of silicon with a donor concentration in the n-type layers of $8\times10^{18}/\text{cm.}^3$ and an acceptor concentration in the p-type layer of $10^{13}/\text{cm.}^3$ should desirably be less than $7.3\times10^{-4}$ cm. In the same structure with an acceptor concentration of $10^{16}/\text{cm.}^3$, the p-type layer should desirably be less than $2.3\times10^{-5}$ cm. In each of these examples the *i* layer is in the order of $10^{-3}$ cm. thick. Where donor and acceptor density are referred to, the excess of one type of element over the other is intended.

Figure 5:
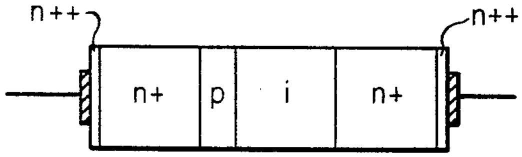
FIGURE 5 is a schematic representation of another embodiment of the invention.

Another embodiment of the invention is shown in FIGURE 5. The device includes a n-p-i-n structure. However, the structure also includes outer n-type zones of high impurity concentration (n++) to form a degenerate layer. Ohmic connection is made to the degenerate layer.

Figure 6:
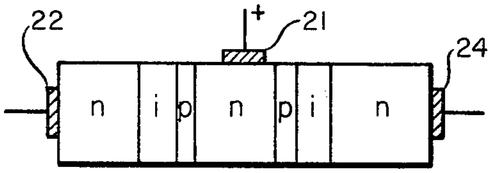
FIGURE 6 shows a semiconductor triode incorporating the present invention.

Referring to FIGURE 6, there is shown a unipolar triode. The triode includes a pair of unipolar diodes, the n-i-p-n diode with the unsymmetrical (ip) barrier region poled so as to permit forward flow of electrons from left to right in the figure and n-p-i-n diode arranged so that electron flow from left to right is in the reverse direction. The work functions of the acceptor dominated p-layers act to retain electrons in the center n-region. The concentration of impurities is again selected so that there is unipolar operation, that is, the concentration of donor and acceptor elements throughout the device are such that nowhere within the diode which acts to inject carriers does the electrostatic potential energy equal the Fermi level.

In the embodiment shown in FIGURE 6, the injecting unipolar diode comprises the n-i-p-n regions on the left-hand side of the figure. The so-called collecting unipolar diode comprises the n-p-i-n regions on the right-hand side of the device. Ohmic connections 22 and 24 are made to the ends of the device and ohmic connection 21 is made to the common or transport region.

Figure 7:
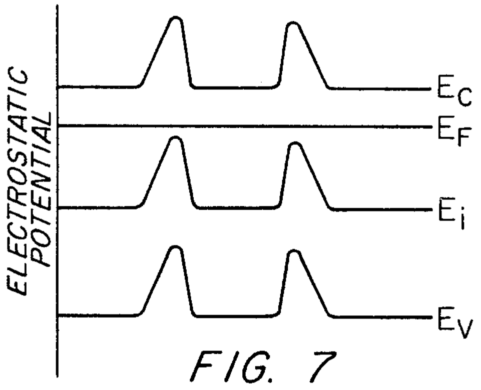
FIGURE 7 is the electrostatic potential energy diagram of the triode shown in FIGURE 6.

FIGURE 7 illustrates the electrostatic potential energy diagram for the structure of FIGURE 6 with no external applied voltage. Again, $E_C$ represents the lower level of the conduction band; $E_V$ represents the upper level of the valence band, the forbidden energy gap lies between the curves $E_C$ and $E_V$; and $E_F$ represents the Fermi level in the material. The p-type zones are made thin enough so that with the particular donor and acceptor concentration existing in the structure, the level of energy $E_i$ at every point in the structure lies below the Fermi level $E_F$. Further, the p-type regions are selected so that the electrostatic potential energy of the p region is lower than of the p+ region whereby there is a difference in electrostatic potential energy.

Figure 8:
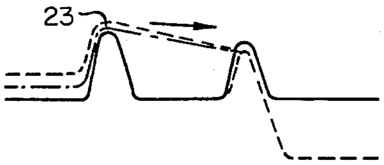
FIGURE 8 is the electrostatic potential energy diagram of the device under operating conditions.

By applying a forward unipolar bias across the right-hand unipolar diode including n-p-i-n regions, that is, making the ohmic contact 22 negative with respect to the ohmic contact 21, the unipolar diode will inject carriers over the p-type work function layer, FIGURE 8. These carriers have energies substantially greater than thermal energy. These so-called "hot carriers" injected into the central transport region diffuse rapidly through the common region. Operation is similar to the operation described with respect to the unipolar diode of FIGURES 1 and 2. Referring to FIGURE 8, application of voltage raises the potential energy in the left-hand n-type region, as shown by the dotted line, whereby electrons flow over the potential hill 23 into the central region. Since the voltage applied may be as high as one-half volt in a silicon device without leading to significant hole concentrations in the work function layer, electrons passing through the barrier layer will arrive in the central or transport region in a "hot" condition have random energies approximately twenty times larger than the normal majority carriers. These injected "hot carriers" diffuse through the layer rapidly, in fact about four or five times farther than they would if injected into a p-type base layer of a junction transistor where they would have random thermal velocities corresponding to an energy of about one-fortieth of a volt.

A reverse bias is applied across the right-hand unipolar diode by applying a positive voltage on the terminal 24 with respect to the terminal 21. The change in the electrostatic potential energy diagram is shown in FIGURE 8. This will provide relatively high fields in this unipolar diode which will sweep or collect the "hot" electrons that diffuse across the transport region and penetrate the work function layer in the (pi) collector transitron. In order for the hot electrons to climb over the work function barrier layer efficiently, this layer should have a lower $E_i$ value than the (ip) layer across which the electrons are injected. This desired difference occurs automatically if the two transition (ip) and (pi) regions are identical in doping levels and widths because the applied potentials distort their relative heights as shown in FIGURE 8. The difference may be further enhanced, however, by making the work function layer on the injecting side stronger than on the collecting side. Such changes will permit with wider transition regions in which hot electrons will lose more energy.

It is instructive to note that the electrons that constitute the control current which flows out of the transport region as thermal carriers to produce forward bias across the injection junction are separated from the hot output carriers that flow through the transport region only by an energy difference. The control carriers are retained in the transport region by the work function layer.

It is to be understood that although a triode device showing one arrangement of conductivity type of the various regions is illustrated, that the opposite conductivity types may be employed. Furthermore, the device may be modified from the structures of FIGURES 1 or 6 by using p layers in place of ip or pi layers and adjusting their widths and impurity concentrations to produce the relative heights shown in FIGURE 8.

Although suppression of unwanted carriers can be accomplished by producing structures that do not have $E_i$ values that cross the Fermi level $E_F$ as discussed in connection with FIGURES 2 and 7, adequate suppression can be achieved with less stringent conditions. For example, a semiconductor with extremely small $n_i$ values, such as silicon carbide at room temperature or silicon or germanium at low temperatures may have $n_i$ values so small that even if unwanted carriers exceeded $n_i$ by a factor of $10^3$ or more, they would make a negligible contribution. A general criterion which can be applied is that the carrier density in work function layers should be negligible compared to majority densities in the adjacent layers.

It is also clear that the unsymmetrical rectifying action of the work function layers arises from their relative thinness and high impurity density compared to the adjacent i layer. From this, it is clear that the properties of the i layer are not critical provided that it is weakly doped and it may be replaced by sufficiently weak p or weak n or by a weakly doped pn or np junction without altering the principles of operation of the devices considered.

Figure 9:
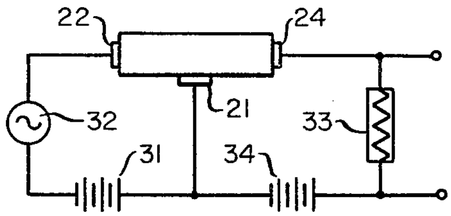
FIGURE 9 shows a circuit incorporating a device of the type shown in FIGURE 6.

FIGURE 9 shows a unipolar triode connected in an amplifying circuit. Unipolar bias 31 is applied in series with a signal 32 to be amplified. The output is derived across a load circuit 33 connected in series with the source 34.

Although these specific embodiments of the invention have been disclosed and discussed, it will be understood that other applications of the invention are possible and that the embodiments disclosed may be subject to changes, modifications and substitution without departing from the spirit or scope of this invention.

I claim:

1. A semiconductor device comprising:

a body of semiconductive material having a plurality of serially adjacent zones, each zone having a predetermined concentration of impurity atoms selected from the group consisting of donors and acceptors;

a first of said zones having an excess of one type of said impurity atoms;

a second of said zones contiguous with said first zone and having an excess of the other type of said impurity atoms to form a potential barrier for majority carriers of said first zone;

a third of said zones contiguous with said second zone and having a carrier life-time substantially greater than said second zone and a net impurity atom concentration which is less than said first and second zones, and said impurity atom concentration in said third zone being such that the ratio of the greater to the lesser of said donor and acceptor concentrations therein does not exceed $10^3$;

a fourth of said zones contiguous with said third zone and having an excess of said one type of said impurity atoms;

and the width of said second zone between said first and third zones being sufficiently small such that any current flowing through said second zone is carried essentially by said majority carriers.

2. A semiconductive device according to claim 1 wherein said second region having an acceptor concentration of $10^{13}/cm.^3$ has a thickness less than $7.3 \times 10^{-4}$ cm.

3. A semiconductor device according to claim 1 wherein said second region having an acceptor concentration of $10^{16}/cm.^3$ has a thickness less than $2.3 \times 10^{-5}$ cm.

4. A majority carrier semiconductor device, comprising:

a body of semiconductor material, the active regions of said body being characterized by a determinable Fermi level in said material;

a first region of one conductivity type in said body, said region containing impurities selected from the group consisting of donors and acceptors, said region having a given excess quantity of impurities corresponding to one member of said group, said excess impurities introducing majority current carriers into said region;

a second region of opposite conductivity type contiguous with said first region, said second region having a predetermined excess quantity of impurities corresponding to the other member of said group, said predetermined quantity being substantially less than said given quantity, the boundary between said regions forming a potential barrier for said majority carriers;

a third region opposite said first region and contiguous with said second region, said third region having a carrier lifetime substantially greater than that of said second region, said third region having a limited excess quantity of impurities selected from said group, said limited quantity being substantially less than said predetermined quantity;

a fourth region of said one conductivity type contiguous with said third region;

said second region being sufficiently thin between said first and third regions such that in the absence of any externally applied potentials the difference between the electrostatic potential energy level and said Fermi level does not change sign in the vicinity of said boundary, whereby any current flowing through said device between said first and fourth regions is carried essentially by said majority carriers; and first and second electrodes contacting said first and fourth regions respectively.

5. A semiconductive device as defined in claim 4 including end zones contiguous with said first and fourth zones, each of said end zones having a relatively high impurity atom concentration of the type of the adjacent zone of said first and fourth zones so that each of said end zones is degenerate.

6. A semiconductor device according to claim 4, further comprising:

a fifth region of said opposite conductivity type contiguous with said first region and opposite said second region, said fifth region having a specified excess quantity of impurities corresponding to said one member of said group, said specified quantity being substantially less than said given quantity, the boundary between said first and fifth regions forming a potential barrier for said majority carriers;

a sixth region opposite said first region and contiguous with said fifth region, said sixth region having a restricted excess quantity of impurities selected from said group, said restricted quantity being substantially less than said specified quantity;

a seventh region of said one conductivity type contiguous with said sixth region; and a third electrode contacting said seventh region;

said fifth region being sufficiently thin between said first and sixth regions such that in the absence of any externally applied potentials the difference between the elestrostatic potential energy level and said Fermi level does not change sign in the vicinity of said boundary between said first and fifth regions, whereby any current flowing through said device between said electrodes is carried essentially by said majority carriers.

7. A semiconductor device according to claim 6, further comprising bias means for applying voltages between said electrodes to decrease the height of a selected one of said potential barriers and to simultaneously increase the height of the other of said potential barriers, thereby to inject said majority carriers across said selected barrier into said first region, the width of said first region being sufficiently small such that said injected majority carriers rapidly diffuse through said first region to penetrate said other potential barrier.

References Cited

UNITED STATES PATENTS

| | | | |
|---|---|---|---|
| 2,767,358 | 10/1956 | Early | 317—239 |
| 2,777,101 | 1/1957 | Cohen | 317—235 |
| 2,838,617 | 6/1958 | Tummers et al. | 317—234 X |
| 2,869,084 | 1/1959 | Shockley | 317—235 X |
| 2,980,810 | 4/1961 | Goldey | 317—235 X |
| 2,981,849 | 4/1961 | Gobat | 317—235 X |
| 3,140,963 | 7/1964 | Svedberg | 148—33.5 |
| 3,260,901 | 7/1966 | Luescher et al. | 317—235 |
| 3,279,963 | 10/1966 | Castrucci et al. | 317—235 X |

JOHN W. HUCKERT, *Primary Examiner.*

A. M. LESNIAK, *Assistant Examiner.*